(12) United States Patent
Aoki et al.

(10) Patent No.: US 7,754,003 B2
(45) Date of Patent: Jul. 13, 2010

(54) COATING COMPOSITION AND LOW DIELECTRIC SILICEOUS MATERIAL PRODUCED BY USING SAME

(75) Inventors: Tomoko Aoki, Tokyo (JP); Hiroyuki Aoki, Tokyo (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 1188 days.

(21) Appl. No.: 10/565,429

(22) PCT Filed: Aug. 4, 2004

(86) PCT No.: PCT/JP2004/011135

§ 371 (c)(1),
(2), (4) Date: Jan. 18, 2006

(87) PCT Pub. No.: WO2005/014743

PCT Pub. Date: Feb. 17, 2005

(65) Prior Publication Data

US 2006/0246303 A1    Nov. 2, 2006

(30) Foreign Application Priority Data

Aug. 12, 2003    (JP)    .............................. 2003-292529

(51) Int. Cl.
*C09D 183/00*    (2006.01)
*B32B 9/00*    (2006.01)

(52) U.S. Cl. .................. 106/287.11; 428/447; 428/688; 427/228; 427/387; 427/397.7

(58) Field of Classification Search ............ 106/287.11; 428/447, 688; 427/387, 228, 397.7
See application file for complete search history.

(56) References Cited

U.S. PATENT DOCUMENTS

| 4,670,057 | A | * | 6/1987 | Oezelli et al. ............... 106/236 |
| 4,975,512 | A |   | 12/1990 | Funayama et al. |
| 5,436,083 | A | * | 7/1995 | Haluska et al. ............. 428/688 |
| 6,562,465 | B1 | * | 5/2003 | Nakashima et al. ......... 428/412 |
| 2004/0028828 | A1 |  | 2/2004 | Oaki et al. |

FOREIGN PATENT DOCUMENTS

| EP | 0 749 155 |   | 12/1996 |
| JP | 1-138107 |   | 5/1989 |
| JP | 8-51271 |   | 2/1996 |
| JP | 9-107171 |   | 4/1997 |
| JP | 2002-75982 |   | 3/2002 |
| WO | 99/55789 | * | 11/1999 |

OTHER PUBLICATIONS

English Language Abstract of JP 1-138107.
English Language Abstract of JP 8-51271.
English Language Abstract of JP 9-107171.
English Language Abstract of JP 2002-75982.

* cited by examiner

*Primary Examiner*—Margaret G Moore
(74) *Attorney, Agent, or Firm*—Alan Kass; Sangya Jain (57) ABSTRACT

The present invention provides a coating composition, which can simply produce a porous siliceous film having excellent mechanical strength and, at the same time, possessing a stable very low level of dielectric and good chemical resistance to various chemicals, and to provide a process for producing a siliceous material using the same. The coating composition according to the present invention comprises a polyalkylsilazane compound, an acetoxysilane compound, an organic solvent, and, if necessary, a pore forming material. The present invention also provides a siliceous material produced by firing the coating composition and a process for producing the same.

5 Claims, 1 Drawing Sheet

COATING COMPOSITION AND LOW DIELECTRIC SILICEOUS MATERIAL PRODUCED BY USING SAME

This application is a United States National Stage Patent Application under 35 U.S.C. §371 of International Patent Application No. PCT/JP2004/011135, filed Aug. 4, 2004, which claims priority to Japanese Patent Application No. 2003-292529, filed Aug. 12, 2003.

TECHNICAL FIELD

This invention relates to a coating composition. The present invention also relates to a process for producing a low-dielectric siliceous material using the coating composition and a low-dielectric siliceous material produced by the production process. Further, the present invention relates to a semiconductor device comprising the thus produced low-dielectric siliceous material.

BACKGROUND ART

In recent years, there is an increasing demand for further increased speed and increased integration density in integrated circuits of semiconductor devices. This has led to a demand for the development of a multilayer wiring process technique for more efficiently realizing enhanced fineness and multilayering of internal wiring in semiconductor devices. An example of this technique is the formation of groove wiring by embedding of a wiring material such as copper (Cu) in the inside of the groove, for example, by a sputter reflow method or a CVD method and further removing a wiring material deposited the outside of the groove, for example, by CMP (chemical mechanical polishing). By virtue of the advance of the groove wiring technique, in semiconductor devices, the fineness of internal wiring can be increased, and, further, in cooperation with surface flattening by CMP, a higher level of multilayering can be realized.

The enhanced integration density of the integrated circuit has led to a demand for further lowered dielectric of an intermetal dielectric present between wirings, a demand for mechanical strength high enough to withstand the step of removing the wiring material by CMP, and further a demand for chemical resistance to various chemicals, for example, chemicals used in CMP, chemicals used in the removal of photoresist by wet stripping when this method is used, and chemicals for removal of residues after ashing when the removal of the photoresist by ashing is carried out.

Thus, an improvement in quality, for example, further lowered dielectric, enhanced mechanical strength, or improved chemical resistance, is required of electronic materials used in semiconductors, such as intermetal dielectrics (IMDs) and premetal dielectrics (PMDs). To meet these demands, various studies have been made on insulating materials.

Among them, the use of various siliceous materials has also been studied. The siliceous material, however, is generally hygroscopic and thus poses a problem that, in some ambient environment, the specific dielectric disadvantageously increases with the elapse of time.

The use of an organic siliceous film formed by firing of a polyorganosilazane is considered effective for preventing the increase in specific dielectric with the elapse of time. The organosiliceous film thus obtained has such a structure that an organic group is attached to a silicon atom in the silica. Therefore, a siliceous film can be produced which has high water repellency, can suppress a moisture absorption-derived increase in specific dielectric with the elapse of time and, at the same time, possesses heat resistance and environmental resistance required as an insulating film for semiconductors.

Patent document 1: Japanese Patent Laid-Open No. 75982/2002

DISCLOSURE OF THE INVENTION

Problems to be Solved by the Invention

In order to meet the above demands for siliceous materials, several methods have been studied. For example, the present inventors have found that a high-strength porous siliceous film can be formed by firing a film of a composition comprising a polyalkylsilazane and a polyacrylic ester or a polymethacrylic ester (patent document 1). The porous siliceous film described in this patent document 1 has the effect of suppressing a moisture absorption-derived increase in specific dielectric with the elapse of time. As a result of further studies by the present inventors, it was found that, for the porous siliceous film, when the specific dielectric is about 2.2, the modulus of elasticity is generally not more than 3 GPa and, thus, there is room for an improvement in film strength.

Further, in the method described in this patent document 1, in the production process, "humidification step" is indispensable for converting a polyalkylsilazane to a lower-dielectric film to advantageously produce a good-quality siliceous film. In this humidification step, at a point of time between after coating of a polysilazane film on a substrate and before heat firing in a dry atmosphere, the polysilazane films are treated either in the atmosphere for a long period of time, for example, for 24 hr, or in a humidified atmosphere, for example, under conditions of 50° C. and 80% RH for 30 min. In the treatment in this humidification step, the conversion of the alkylsilazane to an alkylsilanol is accelerated. When this humidification step is omitted in the conventional method, it is difficult to form a good porous siliceous film. The addition of this humidification step lowers the production efficiency and requires business investment for additionally providing the humidification device. Accordingly, the development of a method for producing a good-quality siliceous film not requiring this humidification step has been desired.

In not only the method disclosed in patent document 1 but also in the production of a conventional siliceous film, a siliceous film is formed by treating the coating film at an elevated temperature. This elevated temperature treatment has hitherto been generally carried out at 400° C. or above. For example, when copper is used as a wiring metal, in order to ensure electrical stability of copper, preferably, the high-temperature throughput (thermal budget) at the time of film formation is reduced to a lower level than the prior art technique. When aluminum is used as a wiring material, a thermal budget of about 400° C. for one hr was acceptable in the prior art. In recent years, however, it is desired that this temperature is lowered to 375° C. and, in some cases, to 350° C.

On the other hand, it is known that, in forming a multilayer wiring structure using a siliceous film in the intermetal dielectric, the formation of a large number of micropores in the siliceous film can realize lowered density and lowered dielectric. In this case, however, what is important is that the diameter of pores formed in the siliceous film is smaller, and that pore diameters are uniform. This is because, when the porous insulating film is exposed to an etching gas, a removing agent or the like used in forming the multilayer wiring structure, the gas or the removing agent sometimes enters large pores and attacks the film. Further, in some cases, stress or heat applied in forming metal wiring or other thin film formation on the porous film triggers expansion of pores. Further, these sites function as a leak path, and, consequently, the porous film does not function as an insulating film. For the above reason, the pore diameter of the porous film is preferably not more than 2 nm. In the conventional method, however, the formation of a porous film with pores having a uniform pore diameter of not more than 2 nm has been difficult.

Means for Solving the Problems

According to the present invention, there is provided a coating composition characterized by comprising a polyalkylsilazane compound, an acetoxysilane compound, and an organic solvent.

Further, according to the present invention, there is provided a siliceous material characterized by being produced by coating the above coating composition onto a substrate or by filling the above coating composition into a groove, and firing the coating composition.

Furthermore, according to the present invention, there is provided a semiconductor device characterized by comprising the above siliceous material as an intermetal dielectric.

Furthermore, according to the present invention, there is provided a process for producing a siliceous material, characterized by comprising heating the above coating composition at a temperature of 350° C. or below for 1 to 60 min.

Effect of the Invention

The present invention solves the problems involved in the production of the above conventional siliceous materials and can provide a coating composition that can simply produce a siliceous material which has mechanical strength high enough to withstand the advanced high integration process including a damascene process, has a low level of dielectric, and are resistant to various chemicals.

Further, in the present invention, the humidification process which is required in the formation of a siliceous film using a silazane compound can be omitted, and, thus, the production process can be simplified.

Further, according to the present invention, the firing temperature can be lowered as compared with the conventional production process of a siliceous film.

This can reduce the thermal budget, the stability of the metal wiring in the electronic material can be improved, and, at the same time, the energy consumption can be reduced to lower the production cost.

When a pore forming agent is used in the coating composition according to the present invention, a very low level of dielectric can be stably provided.

BEST MODE FOR CARRYING OUT THE INVENTION

Polyalkylsilazane Compound

The polyalkylsilazane compound according to the present invention has an alkyl-substituted silazane bond. Although the structure is not limited, preferred polyalkylsilazane compounds comprise repeating units represented by general formula (1):

[Chemical Formula 1]

(1)

wherein $R^1$ represents a hydrogen atom or an alkyl group having 1 to 3 carbon atoms, provided that all of $R^1$s of the whole compound do not simultaneously represent hydrogen; $R^2$ to $R^4$ each independently represent a hydrogen atom or an alkyl group having 1 to 3 carbon atoms, provided that all of $R^2$ to $R^4$ do not simultaneously represent hydrogen; and p, q, and r each are 0 or 1 and $0 \leq p+q+r \leq 3$.

In general formula (1), when $R^1$ represents a methyl group and $R^2$ to $R^4$ exist, preferably, all of $R^2$ to $R^4$ represent hydrogen.

The polyalkylsilazane compound according to the present invention may contain in its structure any one of or both groups represented by formulae (2) and (3):

[Chemical formula 2]

(2)

(3)

wherein $R^5$ to $R^{11}$ each independently represent a hydrogen atom or an alkyl group having 1 to 3 carbon atoms, provided that both $R^5$ and $R^6$ do not simultaneously represent hydrogen and all of $R^9$ to $R^{11}$ do not simultaneously represent hydrogen.

Here in general formula (2), preferably, any one of $R^5$ and $R^6$ represents a hydrogen atom with the other representing a methyl group, and $R^7$ represents a hydrogen atom. In general formula (3), preferably, $R^8$ represents a hydrogen atom, and all of $R^9$ to $R^{11}$ represent a methyl group.

In the present invention, a polyalkylsilazane compound comprising units represented by general formula (1) and units represented by either general formula (2) or (3), or all of units represented by general formulae (1) to (3) is particularly useful because gelation during storage of the coating composition can be prevented. In this case, the number of repeating units represented by general formula (1) is preferably not less than 50% by mole, more preferably not less than 80% by mole, particularly preferably not less than 90% by mole, of the total number of units represented by general formulae (1) to (3). When the number of repeating units represented by general formula (1) is not less than 50% of the total number of repeating units represented by general formulae (1) to (3), problems of unfavorable phenomena such as repelling or uneven coating are less likely to occur during film formation.

The number average molecular weight of the polysilazane compound according to the present invention is preferably not less than 100 from the viewpoint of improving the coatability of the coating composition, particularly spin coatability. Further, the polysilazane compound according to the present invention preferably has a number average molecular weight of not more than 50,000 from the viewpoint of bringing the number of crosslinking groups to a suitable value to suppress the gelation of the composition. In the present invention, particularly preferably, the polyalkylsilazane compound comprises repeating units represented by general formula (1) and units represented by general formula (2) and/or general formula (3). Further, in the present invention, the number average molecular weight of the polyalkylsilazane compound is preferably 100 to 50,000, more preferably 1,000 to 20,000.

These polyalkylsilazanes may be produced by using, in ammonolysis used in the synthesis of the conventional polysilazane which is self-evident to a person having ordinary skill in the art, as a starting material, an alkyltrichlorosilane ($R^1SiCl_3$) in the case of a polyalkylsilazane comprising repeating units represented by general formula (1); a dialkyldichlorosilane ($R^5R^6SiCl_2$) in the case of a polyalkylsilazane comprising repeating units represented by general formula (2); a trialkylchlorosilane ($R^9R^{10}R^{11}SiCl$) in the case of a polyalkylsilazane comprising units represented by general formula (3); or a mixture of the above chlorosilanes in the case of a polyalkylsilazane comprising both the above repeating units. The proportions of the individual units in the polyalkylsilazane are determined by the mixing ratio of these chlorosilanes.

Acetoxysilane Compound

The coating composition according to the present invention comprises an acetoxysilane compound. This acetoxysilane compound comprises 1 to 4 acetoxy groups attached to the silicon atom. When three or less acetoxy groups are attached, substituents such as alkyl and alkoxy groups may be attached to silicon. If necessary, substitution by other groups is also possible.

In the present invention, it is considered that, upon firing, the acetoxysilane compound is thermally decomposed at a relatively low temperature, for example, at about 200° C., to give an acetoxy group which functions like a catalyst capable of accelerating a reaction through which the polyalkylsilazane compound is cured to form a siliceous film, and, thus, the firing temperature necessary for the curing can be lowered and, further, the diameter of the micropores in the porous film can be reduced. It is further considered that the silicon-containing decomposition product of the acetoxysilane compound per se stays in the thin film to strengthen the crosslinking structure formed in the curing and to increase the film strength. In this case, when an acetoxysilane compound comprising an alkyl group attached to silicon is used, the alkyl group is likely to stay in the final porous film and, consequently, the film strength is likely to lower. Accordingly, the acetoxysilane compound should be properly selected according to the contemplated application of the siliceous material.

In the prior art technique, when the siliceous material is formed using the polyalkylsilazane compound, as described above, the humidification step should be provided. This humidification step is provided to convert a part of the polyalkylsilazane to a silanol compound. In the present invention, by virtue of the presence of the acetoxysilane compound, the polyalkylsilazane is converted to the silanol compound in a short time without providing the humidification step. Therefore, when the coating composition according to the present invention is used, the provision of the humidification step in forming the siliceous material is not indispensable. Further, when a pore forming agent which will be described later is used, the state of microscopic phase separation between the pore forming agent and the matrix can be realized in a short time.

In the conventional prior art technique, when the humidification of the polyalkylsilazane is excessive, the amount of the silanol compound becomes excessive. Further, when humidification is carried out for a long period of time, due to the fluidity of the alkylsilanol compound as a matrix, the phase separation from the pore forming agent excessively progresses, leading to macroscopic phase separation which disadvantageously increases the diameter of pores formed by sublimation of the pore forming agent. On the other hand, the present invention is characterized in that the state of optimal microscopic phase separation can be realized in a short time and, further, even when the produced alkylsilanol compound is allowed to stand for a long period of time, excessive phase separation (macroscopic phase separation) from the pore forming agent is less likely to occur. The reason for this is believed to reside in that the acetoxysilane compound-derived silica component inhibits the fluidity of the alkylsilanol compound to suppress macroscopic phase separation.

Further, in the conventional method, when the formation of a siliceous material by using a combination of an alkylsilazane compound with a pore forming agent is contemplated, the silica component is formed only by a dehydration reaction through heating of an alkylsilanol compound. In order to form the silica component in an amount large enough to regulate the fluidity of the alkylsilanol, heating (prebaking) should be carried out at an elevated temperature of 280° C. or above. In this case, when the pore forming agent is burned out, the alkylsilanol compound flows into the burned-out portion and, consequently, pores are not formed. Accordingly, the use of a pore forming agent having heat resistance high enough to avoid burn-out at that temperature is indispensable. This disadvantageously limits usable pore forming agents. By contrast, in the present invention, at the decomposition temperature (around 190° C.) of the acetoxysilane compound, the microscopic phase separation between the matrix and the pore forming agent is already in a substantially completed state, and this microscopically phase separated state is maintained even in a subsequent high-temperature process in which the pore forming agent is sublimated. Therefore, pore forming agents which sublime at a relatively low temperature and have a lower molecular weight than the pore forming agent used in the prior art may be used.

Specific examples of preferred acetoxysilane compounds include tetraacetoxysilane, methyltriacetoxysilane, ethyltriacetoxysilane, ethoxytriacetoxysilane, isopropoxytriacetoxysilane, n-butoxytriacetoxysilane, dimethyidiacetoxysilane, diethyldiacetoxysilane, diisopropyldiacetoxysilane, di-n-butyldiacetoxysilane, dimethoxydiacetoxysilane, diethoxyacetoxysilane, diisopropoxydiacetoxysilane, and di-n-butoxydiacetoxysilane.

Organic Solvents

The coating composition according to the present invention is a solution or dispersion of the above polyalkylsilazane compound and acetoxysilane compound and optional other additives which will be described later in an organic solvent. In this case, the organic solvent is preferably an inert organic solvent free from active hydrogen. Such organic solvents include aromatic hydrocarbon solvents such as benzene, toluene, xylene, ethylbenzene, diethylbenzene, trimethylben- zene, and triethylbenzene; alicyclic hydrocarbon solvents such as cyclohexane, cyclohexene, decahydronaphthalene, ethylcyclohexane, methylcyclohexane, p-menthine, and dipentene (limonene); ether solvents such as dipropyl ether and dibutyl ether; ketone solvents such as methyl isobutyl ketone; and ester solvents such as propylene glycol monomethyl ether acetate.

Pore Forming Agent

The coating composition according to the present invention may contain a pore forming agent from the viewpoint of forming a larger number of smaller and even micropores in the siliceous material after curing. The use of the pore forming agent can further lower the dielectric of the siliceous material formed using the coating composition according to the present invention. Such pore forming agents include polyalkylene oxides, acrylic polymers, or methacrylic polymers. Preferred are (i) siloxy group-containing polyethylene oxide compounds or copolymers comprising them as monomor units, and (ii) homo- and copolymers of acrylic esters or methacrylic esters in which a part of side groups contains a carboxyl, hydroxyl or siloxy group. Regarding carboxyl group- or hydroxyl group-containing acrylic ester or methacrylic acid polymers among them, the pore forming agent is bonded through these groups to the above polyalkylsilazane compound to limit the separation of the pore forming agent. As a result, a composition in which the separation is in a microscopically phase separated state and does not cause the macroscopic phase separation can be provided. Siloxy group-containing acrylic esters or methacrylic acid polymers are advantageous in that, in heat sublimation, the siloxy group constituting a part of the polymer stays in a polyalkylsilazane fired film as the matrix to produce a siliceous material having higher strength.

Pore forming agents which are particularly preferred in the present invention are sililoxy group-containing polyethylene oxide compounds or copolymers comprising them as monomer units. These compounds are such that a polyethylene oxide is contained and, further, siloxy group (Si—O bond) is contained in the structure. Specific examples of siloxy group-containing groups include trimethylsiloxy, dimethylbutylsiloxy, methyl hydrosiloxy, dimethylsiloxy, phenylmethylsiloxy, diphenylsiloxy, methylvinylsiloxy, phenylvinylsiloxy, 2-(trimethoxysilyl)ethyl(meth)acryl, γ-(trimethoxysilyl)propyl(meth)acryl, 2-(trimethylsiloxy)ethyl(meth)acryl, γ-(trimethylsiloxy)propyl(meth)acryl, trimethylsiloxy methacryl, and trimethylsilyloxysiloxanyl groups. The term "(meth) acryl group" as used herein refers to either an acrylic group or a methacrylic group.

One example of such siloxy group-containing polyethylene oxide compounds may be represented by general formula:

HO—(CH$_2$CH$_2$)$_m$-L-(SiR'$_2$—O)$_n$—SiR'$_3$ (A)

wherein R' represents hydrogen or any substituent such as an alkyl or alkoxy group, and, in one molecule, a plurality of types of R's may be present in combination, and R' may be a polymerizable group which may be polymerized with other monomer units;

L represents a linking group, for example, a single bond or an alkylene group; and m and n each are a number representing the degree of polymerization.

The molecular weight of the siloxy group-containing polyethylene oxide compound used in the present invention is not particularly limited. Preferably, however, the molecular weight is 100 to 10,000, more preferably 350 to 1,000.

In the siloxy group-containing polyethylene oxide compound, the structure of polyethylene oxide is not particularly limited. From the viewpoint of properly maintaining the viscosity, however, the weight of the ethyleneoxy part is preferably 30 to 90% based on the weight of the molecule. Further, the weight of the siloxy group part in the polysiloxy structure is preferably 10 to 40%.

Specific examples of preferred siloxy group-containing polyethylene oxide compound include α[3-[1,1,3,3-tetramethyl-1-[(trimethylsilyl)oxy]disiloxanyl]propyl]-ω-hydroxy-poly(oxy-2,3-ethanedyl), hydroxy(polyethyleneoxy) propyl polydimethylsilicone, and MCR-C13, manufactured by Gelest, Inc. (Pennsylvania, US).

Further, compounds, which are selected from the group consisting of homo- and copolymers of (meth)acrylic esters and contain a carboxyl or hydroxyl group in a part of side groups, may also be used as the pore forming agent in the present invention. Such pore forming agents include acrylic ester homopolymers, for example, polymethyl acrylate and polyethyl acrylate; methacrylic ester homopolymers, for example, polymethyl methacrylate and polyethyl methacrylate; acrylic ester copolymers, for example, poly(methyl acrylate-co-ethyl acrylate); methacrylic ester copolymers, for example, poly(methyl methacrylate-co-ethyl methacrylate); and copolymers of acrylic esters with methacrylic esters, for example, poly(methyl acrylate-co-ethyl methacrylate).

When the pore forming agent is a copolymer, the monomer arrangement is not limited, and random copolymers, block copolymers and other any desired monomer arrangement may be used.

Monomers usable for constituting (meth)acrylic ester homopolymers and copolymers include, but are not limited to, methyl methacrylate, ethyl methacrylate, n-butyl methacrylate, i-butyl methacrylate, t-butyl methacrylate, methyl acrylate, ethyl acrylate, n-butyl acrylate, i-butyl acrylate, and t-butyl acrylate. In particular, methyl methacrylate and n-butyl methacrylate, and n-butyl acrylate and i-butyl acrylate are more preferred from the viewpoint of compatibility with the polyalkylsilazane.

In the present invention, the (meth)acrylic ester polymer usable as the pore forming agent contains a carboxyl group and/or a hydroxyl group in at least a part of side groups contained in at least one polymer structure. The carboxyl group and/or the hydroxyl group may be previously incorporated in the monomer for constituting the polymer. Carboxyl group- or hydroxyl group-containing monomers include, but are not limited to, acrylic acid, methacrylic acid, 2-hydroxyethyl methacrylate, 2-hydroxypropyl methacrylate, and 2-hydroxybutyl methacrylate. In particular, acrylic acid, methacrylic acid, and 2-hydroxyethyl methacrylate are preferred from the viewpoint of easiness on a reaction with the polyacrylsilazane compound.

Alternatively, the carboxyl and/or hydroxyl group may be introduced later into side chains in the homo- or copolymer. For example, a carboxyl group may be introduced into the side chain by at least partially hydrolyzing the polymethacrylic ester.

When two or more polymer components are present, the presence of the carboxyl group and/or the hydroxyl group in at least one of them suffices for contemplated results. Accordingly, a mixture of a compound containing neither a carboxyl group nor a hydroxyl group, for example, a polyacrylic ester, with a compound containing a carboxyl group and/or a hydroxyl group, for example, poly(methacrylic ester-co-methacrylic acid) may be used as the polymer component.

The carboxyl group and hydroxyl group contained in the (meth)acrylic ester polymer usable as the pore forming agent, together with the polyalkylsilazane compound, form a crosslinking bond. This crosslinking reaction affects the strength or structure of the final film, and, hence, the content of the carboxyl and hydroxyl groups is important. In order to form a satisfactory crosslinked structure, the content of the carboxyl and hydroxyl groups is preferably not less than 0.01% by mole, more preferably not less than 0.1% by mole, based on the total number of monomers constituting the polymer component. Further, from the viewpoint of preventing gelation caused by excessive degree of crosslinking, the content of the carboxyl and hydroxyl groups is preferably not more than 50% by mole, more preferably not more than 30% by mole.

When the (meth)acrylic ester polymer is used as the pore forming agent, the molecular weight of the polymer is preferably not less than 1,000, more preferably not less than 10,000, from the viewpoint of causing sublimation, decomposition or evaporation of the polymer at a proper temperature to form a porous film. On the other hand, in order to prevent the occurrence of voids and a lowering in film strength caused by the void formation, the molecular weight of the polymer is preferably not more than 800,000, more preferably not more than 200,000.

In the present invention, crotonic acid and isocrotonic acid as structural isomers of methacrylic acid are recognized as equivalents of methacrylic acid. Accordingly, embodiments using crotonic acid and isocrotonic acid and their esters corresponding to methacrylic acid and its esters may also be embraced in the scope of the present invention.

Other Additives

The coating composition according to the present invention may if necessary contain other additives. Such additives include, for example, viscosity modifiers and crosslinking accelerators. Further, for attaining sodium gettering effect or the like when the coating composition is used in semiconductor devices, phosphorus compounds, for example, tris(trimethylsilyl)phosphate, may also be incorporated.

Coating Composition

The coating composition according to the present invention is prepared by dissolving or dispersing the above polyalkylsilazane compound, acetoxysilane compound, and optional pore forming agent or other additives in the above organic solvent and reacting the formulation components. The sequence of dissolution of the components in the organic solvent is not particularly limited. However, the following sequence of dissolution is preferred. Specifically, the alkylsilazane compound and the acetoxysilane compound are mixed in the organic solvent. The mixture is then heated with stirring and is if necessary cooled. Thereafter, a pore forming agent is mixed with stirring. The temperature at which the alkylsilazane compound or the acetoxysilane compound is mixed in the organic solvent is preferably 50 to 200° C., more preferably 80 to 180° C. This temperature may be varied depending upon the type of the components used. The stirring time may vary depending upon the type of components to be reacted and the temperature but is generally about 1 to 24 hr. The temperature at which the pore forming agent or other additives are mixed is preferably 30 to 80° C. from the viewpoint of preventing the gelation of the composition by the reaction. In this case, ultrasonic dispersion for about 5 to 90 min is more preferred because this treatment accelerates the reaction. Two or more solutions, for example, a solution of a polyalkylsilazane compound and a solution of an acetoxysilane compound, may be mixed together. In this case, preferably, temperature conditions are as described above. The mixing of the components or the subsequent reaction may be carried out in any atmosphere. Preferably, however, in order to prevent the incorporation of unnecessary oxygen atoms in the formed crosslinked structure, the mixing and reaction are carried out in an inert atmosphere, for example, in a nitrogen atmosphere.

A method may also be adopted in which, after a reaction of the mixing components, the solvent may be replaced.

The mixing amount of the acetoxysilane compound is preferably not less than 5% by weight based on the weight of the polyalkylsilazane compound in order to effectively attain the catalytic action and film strength increasing effect. The mixing amount of the acetoxysilane compound is preferably not more than 40% by weight based on the weight of the polyalkylsilazane compound from the viewpoints of preventing the precipitation of the polyalkylsilazane compound, maintaining the compatibility of the composition, and preventing uneven film formation.

In the present invention, when the pore forming agent is used, the amount of the pore forming agent added is preferably not less than 5% by weight, more preferably not less than 10% by weight, particularly preferably not less than 20% by weight, based on the weight of the polyalkylsilazane compound in order to effectively realize pore formation in the film. On the other hand, in order to prevent a lowering in film strength caused by void or crack formation, the amount of the pore forming agent added is preferably not more than 50% by weight based on the weight of the polyalkylsilazane compound.

The content of the individual components may vary depending upon the contemplated application of the coating composition. In order to form a siliceous material having satisfactory film thickness, however, the solid content is preferably not less than 5% by weight, and, in order to ensure the storage stability of the coating composition and to maintain the viscosity at a proper value, the solid content is preferably not more than 50% by weight. Specifically, in general, the solid content is preferably 5 to 50% by weight, more preferably 10 to 30% by weight, based on the whole coating composition. In general, when the solid content is 10 to 30% by weight, a generally preferred film thickness of, for example, 2000 to 8000 angstroms, can be provided.

Production Process of Siliceous Material

A siliceous material may be produced by coating the coating composition according to the present invention onto a substrate or filling the coating composition into a frame or a groove, if necessary then drying the coating to remove excessive organic solvent, and firing the coating. When the siliceous material according to the present invention is applied to electronic components such as semiconductor devices, in general, it is common practice to form a siliceous material directly on a semiconductor device by firing the coating composition coated onto a substrate to form a siliceous material.

Methods usable for coating the coating composition onto the surface of a substrate include conventional methods, for example, spin coating, dipping, spraying and transfer methods.

The coating film formed on the surface of the substrate may be fired in various atmospheres. Examples of atmospheres usable herein include substantially water vapor-free atmospheres such as dry air, dry nitrogen, and dry helium, and water vapor-containing atmospheres such as air, humidified air, and humidified nitrogen. The firing temperature may be below the conventional firing temperature by virtue of the action of the acetoxysilane compound contained in the coating composition according to the present invention. The firing temperature is generally 380° C. or below, more preferably 350° C. or below. On the other hand, in order to realize satisfactory firing in a short time, the firing temperature is preferably 250° C. or above, more preferably 300° C. or above. The firing time varies depending upon firing temperature and formulation components. In general, however, the firing time is 1 min to 1 hr.

The humidification step which is indispensable to the conventional method for siliceous material formation using an alkylsilazane compound may be omitted when the coating composition according to the present invention is used. This can simplify the process or can realize a reduction in production cost. If necessary, however, the humidification step may be combined. When the humidification step is used in combination with the production process of a siliceous material according to the present invention, a method is preferably adopted in which, after the formation of a coating film on the surface of a substrate, the film is preheated in a water vapor-containing atmosphere, is then allowed to stand in a humidified atmosphere for a short period of time (for example, for 3 to 30 min), or in the atmosphere for a long period of time (for example, for 24 hr), and is then heat fired in a dry atmosphere. In this case, the content of water vapor in the water vapor-containing atmosphere is not less than 0.1% by volume, preferably not less than 1% by volume. Such atmospheres include air, humidified air, and humidified nitrogen gas. On the other hand, the water vapor content of the dry atmosphere is not more than 0.5% by volume, preferably not more than 0.05% by volume. Dry atmospheres include dried air, nitrogen gas, argon gas, and helium gas. The preheating temperature is generally 50 to 300° C.

In the step of firing, only the SiN bond among SiH, SiR (R: hydrocarbon group), and SiN bonds in the polyalkylsilazane is oxidized and converted to an SiO bond, and, thus, a siliceous film containing unoxidized SiH and SiR bonds is formed. Thus, in the formed siliceous film, the SiO bond formed by selective oxidation of the SiN bond and the unoxidized SiH and SiR bonds can be allowed to exist, and, consequently, a low-density siliceous film can be provided. In general, the dielectric of the siliceous film lowers with lowering the film density. On the other hand, when the film density is lowered, the adsorption of water which is a high-dielectric substance occurs, often leading to a problem that, when the siliceous film is exposed in the air, the dielectric of the film is increased. On the other hand, in the case of the siliceous film according to the present invention containing SiH and SiR bond, since these bonds are water-repellent, the adsorption of water can be prevented despite the low density. Accordingly, the siliceous material according to the present invention is greatly advantageous in that, even when the material is allowed to stand in the air containing water vapor, the dielectric of the film is not substantially increased. Further, in the siliceous material according to the present invention, the acetoxysilane compound is decomposed, and the decomposition product is evaporated or sublimated to further lower the density, resulting in further lowered specific dielectric of the siliceous material. Further, the density is so low that, advantageously, the internal stress of the film is small and cracking is less likely to occur.

Regarding other properties of the siliceous material according to the present invention, the density is 0.5 to 1.6 g/cm$^3$, preferably 0.8 to 1.4 g/cm$^3$, the crack limiting film thickness is not less than 1.0 μm, preferably not less than 5 μm, and the internal stress is not more than 100 MPa, preferably not more than 80 MPa. Further, the content of the Si-containing group present as a SiH or SiR (R: hydrocarbon group) bond contained in the siliceous material is 10 to 100 atomic %, preferably 25 to 75 atomic %, based on the number of Si atoms contained in the material. Further, the content of Si present as the SiN bond is not more than 5 atomic %. The thickness of the siliceous film obtained after firing may vary depending upon the application of the surface of the substrate. In general, however, the thickness of the siliceous film after firing is 0.01 to 5 μm, preferably 0.1 to 2 μm. In particular, when the siliceous film is used as an intermetal dielectric in semiconductors, the thickness is preferably 0.1 to 2 μm.

In firing the coating composition according to the present invention, in particular, when a pore forming agent is used, micropores mainly having a diameter of 0.5 to 3 nm are formed within the siliceous film. Therefore, the specific dielectric is very low. Thus, in the porous siliceous material according to the present invention, when a pore forming agent is used, since very fine pores are formed, the mechanical strength is high. Specifically, the porous siliceous material according to the present invention has a modulus of elasticity of not less than 3 GPa, in some cases not less than 5 GPa, as measured by a nanoindentation method which will be described later, that is, has significantly high mechanical strength for a porous siliceous material.

Since the siliceous material has both mechanical strength high enough to withstand the step of removing the wiring material by CMP and resistance to various chemicals, the siliceous material can be used as an intermetal dielectric compatible with an advanced high integration process including a damascene process.

Further, in the siliceous material according to the present invention, a satisfactory amount of water repellent groups derived from the polyalkylsilazane compound as the matrix component remain unremoved after firing. Therefore, even when the siliceous material is allowed to stand in the air containing water vapor, the specific dielectric does not substantially increase. Thus, according to the present invention, a lowering in density/imparting of water repellency can be realized by the bonding component (SiH, SiR) in the siliceous material. Further, when a pore forming agent is used, in cooperation with a lowering in density of the whole film by micropores, a porous siliceous material which can stably maintain a very low specific dielectric of less than 2.5, preferably not more than 2.0, in some cases about 1.6, can be provided.

As described above, advantageously, the siliceous material according to the present invention has low density, and the crack limiting film thickness, that is, the maximum film thickness necessary for the formation of a film without cracking, is as high as not less than 5 μm. In the conventional siliceous film, the crack limiting film thickness is about 0.5 to 1.5 μm.

Thus, as compared with the conventional siliceous material, the siliceous material according to the present invention has lower dielectric, lower density, higher water repellency, better chemical resistance and higher mechanical strength and further can stably maintain the low dielectric. In particular, the siliceous material according to the present invention is preferably applied to intermetal dielectrics and premetal dielectrics in semiconductor devices, especially intermetal dielectrics.

The siliceous material according to the present invention can enhance the silicon content. This is by virtue of the incorporation of an acetoxysilane compound. Thus, due to the high silicon content, the siliceous material according to the present invention is characterized by having higher strength than siliceous materials produced by the conventional method using a polyalkylsilazane.

The present invention will be described with reference to Examples. Evaluations of various properties of siliceous films will be described at the end of Examples at a time.

REFERENCE EXAMPLE 1

Synthesis of Polymethylsilazane

A stainless steel tank for raw material supply was mounted on a stainless steel tank reactor having an internal volume of 5 L. The air within the reactor was replaced by dry nitrogen. Thereafter, 780 g of methyltrichlorosilane was placed in the stainless steel tank for raw material supply and was pressure fed and introduced into the reaction tank by nitrogen. Next, a raw material supply tank containing pyridine was connected to the reactor, and 4 kg of pyridine was pressure fed by nitrogen and was introduced into in the same manner as described above. The pressure of the reactor was regulated to 1.0 kg/cm$^2$, and the temperature was regulated so that the temperature of the mixed solution within the reactor was brought to −4° C. Ammonia was blown into the mixed solution with stirring, and, when the pressure of the reactor reached 2.0 kg/cm$^2$, the supply of ammonia was stopped. An exhaust line was opened to lower the pressure of the reactor, and, subsequently, dry nitrogen was blown into the liquid layer for one hr to remove excess ammonia. The product thus obtained was filtered under pressure through a pressure filter in a dry nitrogen atmosphere to give 3200 mL of a filtrate. Pyridine was removed by evaporation by means of an evaporator to give about 340 g of polymethylsilazane.

The number average molecular weight of the polymethylsilazane thus obtained was measured by gas chromatography using chloroform as a developing liquid. As a result, it was found that the number average molecular weight was 1800 in terms of polystyrene. An infrared absorption spectrum (hereinafter referred to as "IR spectrum") of the polymethylsilazane was measured. As a result, absorption attributable to N—H bond was observed at wavenumbers 3350 cm$^{-1}$ and around 1200 cm$^{-1}$; absorption attributable to Si—C bond was observed at 2900 cm$^{-1}$ and 1250 cm$^{-1}$; and absorption attributable to Si—N—Si bond was observed at 1020 to 820 cm$^{-1}$.

REFERENCE EXAMPLE 2

Preparation of Siliceous Film Using Only Polymethylsilazane

Polymethylsilazane (5 g) synthesized in Reference Example 1 was introduced into and was thoroughly dissolved in 15 g of propylene glycol monomethyl ether acetate (hereinafter referred to as "PGMEA") with a stirrer at room temperature under a dry nitrogen atmosphere. Subsequently, the solution was filtered though a PTFE syringe filter (manufactured by Advantec) with a filtration accuracy of 0.2 µm. The filtrate was spin coated onto a silicon wafer having a diameter of 10.2 cm (4 in.) and a thickness of 0.5 mm under conditions of 1500 rpm/20 sec, and the coating was dried at room temperature for 3 min. This silicon wafer was heated in the atmosphere (relative humidity 40% at 23° C.) at 150° C. for 3 min and then on a hot plate of 250° C. for 3 min and was allowed to stand for moisture absorption in a clean room (relative humidity 40% at 23° C.) for 24 hr. After standing, the silicon wafer was fired in a dry nitrogen atmosphere under conditions of 350° C./30 min to form a siliceous film.

Figure 1:
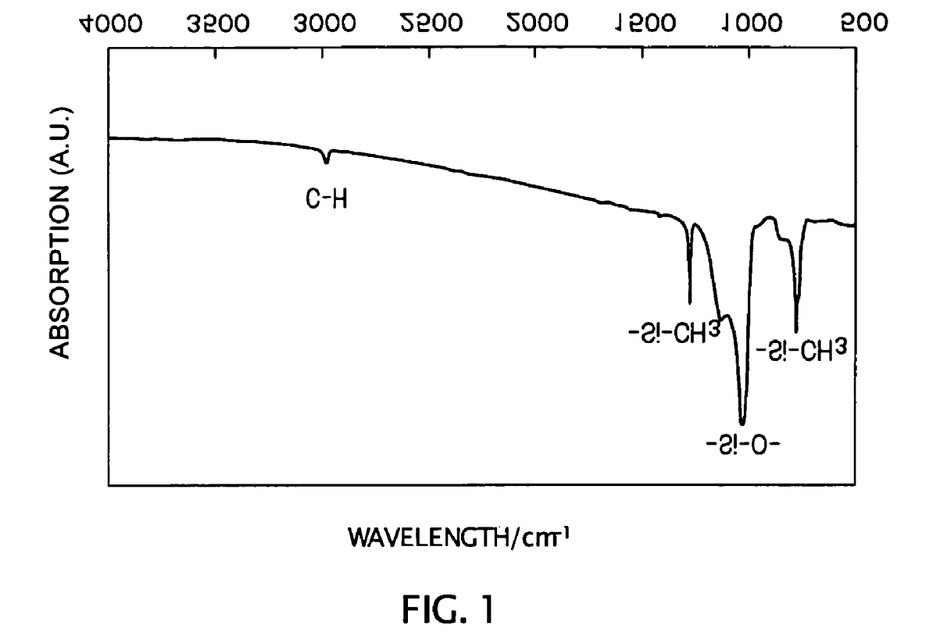
FIG. 1 is an IR spectrum of a siliceous film using a polymethylsilazane only prepared in Reference Example 2.
Figure 2:
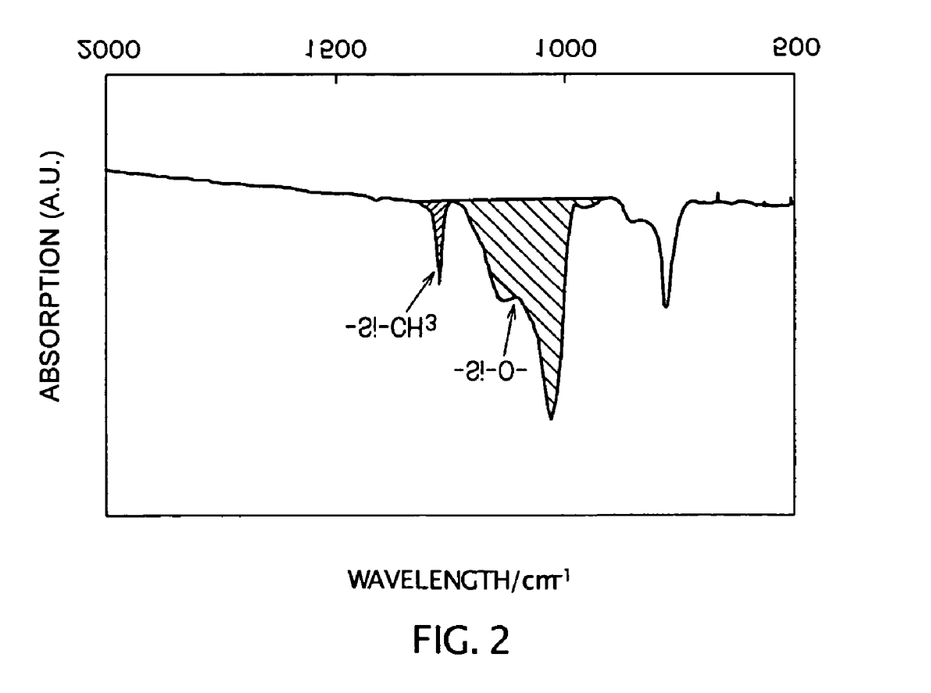
FIG. 2 is an enlarged view of an IR spectrum of a siliceous film using a polymethylsilazane only prepared in Reference Example 2.

An IR spectrum for the siliceous film was as shown in FIG. 1. Absorption peaks derived from Si—O bond were observed at around 1050 to 1200 cm$^{-1}$ and 450 cm$^{-1}$, absorption peaks derived from Si—C bond were observed at 1280 cm$^{-1}$ and 750 cm$^{-1}$, and an absorption peak derived from C—H bond was observed at 2950 cm$^{-1}$. On the other hand, absorption peaks derived from N—H bond were observed at 3350 cm$^{-1}$ and 1200 cm$^{-1}$ disappeared. Based on the IR spectrum, the ratio of the area of absorption derived from Si—O bond at around 1050 to 1200 cm$^{-1}$ (P1) to the area of absorption derived from Si—C bond at 1280 cm$^{-1}$ (P2), that is, (area P1)/(area P2), was calculated by a peak division method as shown in FIG. 2 and was found to be 17.0.

The siliceous film thus obtained was evaluated. As a result, it was found that the specific dielectric, the density, the internal stress, and the crack limiting film thickness were 2.90, 1.41 g/cm$^3$, 50 MPa, and not less than 3 µm, respectively. The film was allowed to stand in the atmosphere under conditions of temperature 23° C. and relative humidity 50% for one week. Thereafter, the specific dielectric was again measured and was found to be 2.90, that is, remained unchanged. For this film, the modulus of elasticity as measured by a nanoindentation method was 4.9 GPa.

EXAMPLE 1

Tetraacetoxysilane (1.65 g) was added to 100 g of a 5% xylene solution of polymethylsilazane synthesized in Reference Example 1, and the mixture was heated in a nitrogen atmosphere at 150° C. for 30 min. This solution was concentrated with an evaporator, and the solvent was replaced with PGMEA. In this case, the amount of PGMEA was 25 g. Subsequently, the solution was filtered through a PTFE syringe filter (manufactured by Advantec) with a filtration accuracy of 0.2 µm. The filtrate was spin coated onto a silicon wafer having a diameter of 10.2 cm (4 in.) and a thickness of 0.5 mm under conditions of 1500 rpm/20 sec, and the coating was dried at room temperature for 3 min. This silicon wafer was heated in the atmosphere (relative humidity 40% at 23° C.) at 100° C. for 3 min and then on a hot plate of 190° C. for 3 min and was subsequently fired in a dry nitrogen atmosphere under conditions of 350° C./30 min to form a siliceous film.

For an IR spectrum for the siliceous film, absorption peaks derived from Si—O bond were observed at around 1050 to 1200 cm$^{-1}$ and 450 cm$^{-1}$, absorption peaks derived from Si—C bond were observed at 1280 cm$^{-1}$ and 780 cm$^{-1}$, and an absorption peak derived from C—H bond was observed at 2980 cm$^{-1}$. On the other hand, absorption peaks derived from N—H bond at 3350 cm$^{-1}$ and 1200 cm$^{-1}$ and an absorption peak derived from the acetoxy group in tetraacetoxysilane disappeared. Based on the IR spectrum, the ratio of the area of absorption derived from Si—O bond at around 1050 to 1200 cm$^{-1}$ (P1) to the area of absorption derived from Si—C bond at 1280 cm$^{-1}$ (P2), that is, (area P1)/(area P2), was calculated and was found to be 22.4.

The siliceous film thus obtained was evaluated. As a result, it was found that the specific dielectric, the density, the internal stress, and the crack limiting film thickness were 2.81, 1.39 g/cm$^3$, 64 MPa, and not less than 2 µm, respectively. In this Example, despite the fact that any pore forming agent is not used, the film density is low. The reason for this is believed to reside in that a part of the acetoxy group in the added tetraacetoxysilane and the silica component are scattered during firing leading to slightly lowered density.

The film thus formed was allowed to stand in the atmosphere (temperature 23° C. and relative humidity 50%) for one week and was again measured for specific dielectric. As a result, it was found that the specific dielectric was 2.86, that is, was slightly increased, but was still on such a level that did not pose any practical problem. For this film, the modulus of elasticity was measured by a nanoindentation method and was found to be 6.2 GPa.

EXAMPLE 2

Tetraacetoxysilane (1.25 g) was added to 100 g of a 5% xylene solution of the polymethylsilazane synthesized in Reference Example 1, and the mixture was heated in a nitrogen atmosphere at 150° C. for 30 min. This solution was concentrated with an evaporator, and the solvent was replaced with PGMEA. In this case, the amount of PGMEA was 95 g. Further, 3.2 g of hydroxy(polyethyleneoxy) propyl-terminated silicone (MCR-C13 (tradename), manufactured by Gelest, Inc.) was added thereto, and the mixture was heated in a nitrogen atmosphere at 80° C. for 3 hr. The mass of this mixture was measured and was found to be 98 g. The mixture was then concentrated with an evaporator to evaporate about 31 g of PGMEA as the solvent and thus to give a PGMEA solution having a solid content of about 15%. Subsequently, the solution was filtered through a PTFE syringe filter (manufactured by Advantec) with a filtration accuracy of 0.2 μm. The filtrate was spin coated onto a silicon wafer having a diameter of 10.2 cm (4 in.) and a thickness of 0.5 mm under conditions of 1500 rpm/20 sec, and the coating was dried at room temperature for 3 min. This silicon wafer was heated in the atmosphere (relative humidity 40% at 23° C.) at 100° C. for 3 min and then on a hot plate of 190° C. for 3 min and was subsequently fired in a dry nitrogen atmosphere under conditions of 350° C./30 min to form a siliceous film.

For an IR spectrum for the siliceous film, absorption peaks derived from Si—O bond were observed at around 1020 to 1200 $cm^{-1}$ and 450 $cm^{-1}$, absorption peaks derived from Si—C bond were observed at 1280 $cm^{-1}$ and 780 $cm^{-1}$, and an absorption peak derived from C—H bond was observed at 2980 $cm^{-1}$. On the other hand, absorption peaks derived from N—H bond at 3350 $cm^{-1}$ and 1200 $cm^{-1}$ and an absorption peak derived from the hydroxy(polyethyleneoxy)propyl-terminated silicone and an absorption peak derived from tetraacetoxysilane disappeared. Based on the IR spectrum, the ratio of the area of absorption derived from Si—O bond at around 1020 to 1200 $cm^{-1}$ (P1) to the area of absorption derived from Si—C bond at 1280 $cm^{-1}$ (P2), that is, (area P1)/(area P2), was calculated and was found to be 22.7, indicating that the absorption derived from Si—O bond was larger than that of the siliceous film prepared in Reference Example 2. The reason for this is believed to reside in that the Si—O bond derived from the decomposition product of tetraacetoxysilane was incorporated in the formed film.

The siliceous film thus obtained was evaluated. As a result, it was found that the specific dielectric, the density, the internal stress, and the crack limiting film thickness were 2.24, 1.29 $g/cm^3$, 51 MPa, and not less than 3 μm, respectively. The film thus formed was allowed to stand in the atmosphere (temperature 23° C. and relative humidity 50%) for one week and was again measured for specific dielectric. As a result, it was found that the specific dielectric was 2.27, that is, was slightly increased, but was still on such a level that did not pose any practical problem.

For this film, the modulus of elasticity as measured by the nanoindentation method was 5.2 GPa. Further, the pore diameter of the siliceous film was measured by an X-ray diffuse scattering method. As a result, it was found that the average pore diameter was 18 angstroms.

EXAMPLE 3

A siliceous film was prepared in the same manner as in Example 2, except that methyltriacetoxysilane was used instead of tetraacetoxysilane. For the formed film, an IR spectrum was measured. As a result, it was found that the peak positions were quite the same as those in Example 2. Specifically, for an IR spectrum for the siliceous film, absorption peaks derived from Si—O bond were observed at around 1020 to 1200 $cm^{-1}$ and 450 $cm^{-1}$, absorption peaks derived from Si—C bond were observed at 1280 $cm^{-1}$ and 780 $cm^{-1}$, and an absorption peak derived from C—H bond was observed at 2980 $cm^{-1}$. On the other hand, absorption peaks derived from N—H bond at 3350 $cm^{-1}$ and 1200 $cm^{-1}$, an absorption peak derived from the hydroxy(polyethyleneoxy) propyl-terminated silicone, and an absorption peak derived from methyltriacetoxysilane disappeared. Based on the IR spectrum, the ratio of the area of absorption derived from Si—O bond at around 1020 to 1200 $cm^{-1}$ (P1) to the area of absorption derived from Si—C bond at 1280 $cm^{-1}$ (P2), that is, (area P1)/(area P2), was calculated and was found to be 20.6.

The siliceous film thus obtained was evaluated. As a result, it was found that the specific dielectric, the density, the internal stress, and the crack limiting film thickness were 2.30, 1.21 $g/cm^3$, 46 MPa, and not less than 3 μm, respectively. The film thus formed was allowed to stand in the atmosphere (temperature 23° C. and relative humidity 50%) for one week and was again measured for specific dielectric. As a result, it was found that the specific dielectric was 2.22, that is, was slightly increased, but was still on such a level that did not pose any practical problem.

For this film, the modulus of elasticity as measured by the nanoindentation method was 5.1 GPa. Further, the pore diameter of the siliceous film was measured by an X-ray diffuse scattering method. As a result, it was found that the average pore diameter was 19 angstroms.

EXAMPLE 4

A siliceous film was prepared in the same manner as in Example 2, except that a polyethylene glycol methyl ether having a number average molecular weight of 550 was used instead of hydroxy(polyethyleneoxy)propyl-terminated silicone. For the formed film, an IR spectrum was measured. As a result, absorption peaks derived from Si—O bond were observed at around 1030 to 1200 $cm^{-1}$ and 450 $cm^{-1}$, absorption peaks derived from Si—C bond were observed at 1270 $cm^{-1}$ and 780 $cm^{-1}$, and an absorption peak derived from C—H bond was observed at 2980 $cm^{-1}$. On the other hand, absorption peaks derived from N—H bond at 3350 $cm^{-1}$ and 1200 $cm^{-1}$, an absorption peak derived from polyethylene glycol methyl ether and an absorption peak derived from tetraacetoxysilane disappeared. Based on the IR spectrum, the ratio of the area of absorption derived from Si—O bond at around 1030 to 1200 $cm^{-1}$ (P1) to the area of absorption derived from Si—C bond at 1280 $cm^{-1}$ (P2), that is, (area P1)/(area P2), was calculated and was found to be 21.9.

The siliceous film thus obtained was evaluated. As a result, it was found that the specific dielectric, the density, the internal stress, and the crack limiting film thickness were 2.35, 1.30 $g/cm^3$, 59 MPa, and not less than 3 μm, respectively. The film thus formed was allowed to stand in the atmosphere (temperature 23° C. and relative humidity 50%) for one week and was again measured for specific dielectric. As a result, it was found that the specific dielectric was 2.38, that is, was slightly increased, but was still on such a level that did not pose any practical problem.

For this film, the modulus of elasticity as measured by the nanoindentation method was 5.3 GPa. Further, the pore diameter of the siliceous film was measured by an X-ray diffuse scattering method. As a result, it was found that the average pore diameter was 19 angstroms.

EXAMPLE 5

A siliceous film was prepared in the same manner as in Example 1, except that the amount of tetraacetoxysilane added was changed to 1.65 g and the amount of the hydroxy (polyethyleneoxy)propyl-terminated silicone added was changed to 1.65 g. For the formed film, an IR spectrum was measured. As a result, absorption peaks derived from Si—O bond were observed at around 1040 to 1200 cm$^{-1}$ and 460 cm$^{-1}$, absorption peaks derived from Si—C bond were observed at 1250 cm$^{-1}$ and 750 cm$^{-1}$, and an absorption peak derived from C—H bond was observed at 2980 cm$^{-1}$. On the other hand, absorption peaks derived from N—H bond at 3350 cm$^{-1}$ and 1200 cm$^{-1}$, an absorption peak derived from the hydroxy(polyethyleneoxy)propyl-terminated silicone, and an absorption peak derived from methyltriacetoxysilane disappeared. Based on the IR spectrum, the ratio of the area of absorption derived from Si—O bond at around 1040 to 1200 cm$^{-1}$ (P1) to the area of absorption derived from Si—C bond at 1280 cm$^{-1}$ (P2), that is, (area P1)/(area P2), was calculated and was found to be 23.1.

The siliceous film thus obtained was evaluated. As a result, it was found that the specific dielectric, the density, the internal stress, and the crack limiting film thickness were 2.52, 1.37 g/cm$^3$, 62 MPa, and not less than 3 µm, respectively. The film thus formed was allowed to stand in the atmosphere (temperature 23° C. and relative humidity 50%) for one week and was again measured for specific dielectric. As a result, it was found that the specific dielectric was 2.53, that is, was slightly increased, but was still on such a level that did not pose any practical problem.

For this film, the modulus of elasticity as measured by the nanoindentation method was 5.5 GPa.

EXAMPLE 6

A siliceous film was prepared in the same manner as in Example 1, except that the temperature in firing the composition was changed from 350° C. to 400° C. For the formed film, the peak positions of the IR spectrum remained substantially unchanged from the siliceous film prepared in Example 1, and the ratio of the area of absorption derived from Si—O bond at around 1050 to 1200 cm$^{-1}$ (P1) to the area of absorption derived from Si—C bond at 1280 cm$^{-1}$ (P2), that is, (area P1)/(area P2), was calculated and was found to be 17.0.

The siliceous film thus obtained was evaluated. As a result, it was found that the specific dielectric, the density, the internal stress, and the crack limiting film thickness were 2.21, 1.31 g/cm$^3$, 54 MPa, and not less than 3 µm, respectively. The film thus formed was allowed to stand in the atmosphere (temperature 23° C. and relative humidity 50%) for one week and was again measured for specific dielectric. As a result, it was found that the specific dielectric was 2.25, that is, was slightly increased, but was still on such a level that did not pose any practical problem.

For this film, the modulus of elasticity as measured by the nanoindentation method was 5.0 GPa. Further, the pore diameter of the siliceous film was measured by an X-ray diffuse scattering method. As a result, it was found that the average pore diameter was 18 angstroms.

A comparison of the results of this Examples with the results of Example 1 shows that, when the composition according to the present invention is used, the adoption of a firing temperature of 350° C., that is, below the firing temperature of 400° C. or above adopted in the prior art technique, can provide a siliceous film having properties which are substantially the same as the siliceous film formed by adopting the firing temperature of 400° C. or above adopted in the prior art technique. When the heating temperature of the coating composition is lowered, the thermal budget can be lowered and, at the same time, properties comparable to those of the siliceous film formed by the conventional method can be realized. Further, energy consumption can be reduced, and the production cost can also be reduced.

COMPARATIVE EXAMPLE 1

An experiment was carried out in which the acetoxysilane compound was not added. Specifically, 100 g of a 5% xylene solution of polymethylsilazane synthesized in Reference Example 1 was heated in a nitrogen atmosphere at 150° C. for 30 min. This solution was concentrated with an evaporator, and the solvent was replaced with PGMEA. In this case, the content of PGMEA was 95 g. Further, 3.2 g of hydroxy (polyethyleneoxy)propyl-terminated silicone (MCR-C13 (tradename), manufactured by Gelest, Inc.) was added thereto, and the mixture was heated in a nitrogen atmosphere at 80° C. for 3 hr. The mass of this mixture was measured and was found to be 95 g. The mixture was then concentrated with an evaporator to evaporate about 10 g of PGMEA as the solvent and thus to give a PGMEA solution having a solid content of about 15%. Subsequently, the solution was filtered though a PTFE syringe filter (manufactured by Advantec) with a filtration accuracy of 0.2 µm. The filtrate was spin coated onto a silicon wafer having a diameter of 10.2 cm (4 in.) and a thickness of 0.5 mm under conditions of 1500 rpm/20 sec and was allowed to stand for moisture absorption in a clean room (relative humidity 40% at 23° C.) for 24 hr (humidification step). This silicon wafer was heated in the atmosphere (relative humidity 40% at 23° C.) at 100° C. for 3 min and then on a hot plate of 190° C. for 3 min. Subsequently, the heated silicon wafer was fired in a dry nitrogen atmosphere under conditions of 350° C./30 min to form a siliceous film.

For an IR spectrum for the siliceous film, absorption peaks derived from Si—O bond were observed at around 1020 to 1200 cm$^{-1}$ and 450 cm$^{-1}$, absorption peaks derived from Si—C bond were observed at 1280 cm$^{-1}$ and 780 cm$^{-1}$, and an absorption peak derived from C—H bond was observed at 2980 cm$^{-1}$. On the other hand, absorption peaks derived from N—H bond at 3350 cm$^{-1}$ and 1200 cm$^{-1}$ and an absorption peak derived from the hydroxy(polyethyleneoxy)propyl-terminated silicone disappeared. Based on the IR spectrum, the ratio of the area of absorption derived from Si—O bond at around 1020 to 1200 cm$^{-1}$ (P1) to the area of absorption derived from Si—C bond at 1280 cm$^{-1}$ (P2), that is, (area P1)/(area P2), was calculated and was found to be 17.4.

The siliceous film thus obtained was evaluated. As a result, it was found that the specific dielectric, the density, the internal stress, and the crack limiting film thickness were 2.64, 1.15 g/cm$^3$, 38 MPa, and not less than 3 µm, respectively. The film thus formed was allowed to stand in the atmosphere (temperature 23° C. and relative humidity 50%) for one week and was again measured for specific dielectric. As a result, it was found that the specific dielectric was 2.64, that is, remained unchanged.

For this film, the modulus of elasticity as measured by the nanoindentation method was 4.2 GPa.

COMPARATIVE EXAMPLE 2

An experiment was carried out in which no acetoxysilane compound was added and the humidification step was omitted. Specifically, a solution was prepared and filtered in the same manner as in Comparative Example 1. Thereafter, the filtrate was spin coated onto a silicon wafer having a diameter of 10.2 cm (4 in.) and a thickness of 0.5 mm under conditions of 1500 rpm/20 sec, and the coating was dried at room temperature for 3 min. This silicon wafer was heated in the atmosphere (relative humidity 40% at 23° C.) at 100° C. for 3 min and then on a hot plate of 190° C. for 3 min. Subsequently, the heated silicon wafer was fired in a dry nitrogen atmosphere under conditions of 350° C./30 min to form a siliceous film.

For an IR spectrum for the siliceous film, absorption peaks derived from Si—O bond were observed at around 1020 to 1200 $cm^{-1}$ and 450 $cm^{-1}$, absorption peaks derived from Si—C bond were observed at 1280 $cm^{-1}$ and 780 $cm^{-1}$, and an absorption peak derived from C—H bond was observed at 2980 $cm^{-1}$. Absorption peaks derived from N—H bond were observed at 3350 $cm^{-1}$ and 1200 $cm^{-1}$ and broad absorption peaks derived from Si—OH bond were observed at around 920 $cm^{-1}$ and 3700 $cm^{-1}$. On the other hand, an absorption peak derived from the hydroxy(polyethyleneoxy)propyl-terminated silicone disappeared.

The siliceous film thus obtained was evaluated. As a result, the specific dielectric immediately after the firing was 3.65. After standing in the atmosphere (temperature 25° C., relative humidity 40%) for 3 hr, the specific dielectric exceeded 4.5, indicating that significant moisture absorption occurred.

[Method for Evaluation of Properties of Siliceous Film]

Specific Dielectric

A Pyrex (registered trademark, manufactured by Dow Corning) glass plate (thickness 1 mm, size 50 mm×50 mm) was well washed with a neutral detergent, a dilute aqueous NaOH solution, and a dilute aqueous $H_2SO_4$ solution in that order and was then dried. An aluminum film is formed on the whole area of this glass plate by vacuum deposition (thickness: 0.2 μm). A sample composition solution was spin coated onto this glass plate to form a film. Thereafter, four corners of the glass plate were rubbed with a swab to remove the film from that parts for drawing signals from an electrode (3 mm×3 mm). Subsequently, the film is converted to a siliceous film according to the method described in each Example. The siliceous film is covered with a stainless steel mask, and an aluminum film is formed by vacuum deposition. 18 patterns in squares of 2 mm×2 mm and having a thickness of 2 μm are formed. The capacitance is measured with a 4192 ALF impedance analyzer (manufactured by Yokogawa-Hewlett-Packard, Ltd.) at 100 kHz. An M-44 spectroscopic ellipsometer (manufactured by J. A. Woollam Co., Inc.) is used for the measurement of the film thickness. For all the 18 patterns, the specific dielectric is the average of values obtained by the following equation.

(Specific dielectric)=(Capacitance[pF])×(Film thickness[μm])/35.4

Film Density

The weight of a silicon wafer having a diameter of 10.16 cm (4 in.) and a thickness of 0.5 mm was measured with an electrobalance. The sample composition solution was spin coated onto the silicon wafer to form a film which was then converted to a siliceous film by the method described in each Example. The weight of the silicon wafer with the film was then again measured with an electrobalance. The difference in weight between the measured weight of the wafer before film formation and the measured weight of the wafer after film formation is regarded as the weight of the film. The film thickness is measured with a spectroscopic ellipsometer (model M-44, manufactured by J. A. Woollam). The film density is calculated by the following equation.

(Film density[g/$cm^3$])=(Film weight[g])/(Film thickness[μm])/0.008

Internal Stress

A warpage of a silicon wafer having a diameter of 20.32 cm (8 in.) and a thickness of 1 mm is placed in a laser internal stress measuring device (FLX-2320, manufactured by Tencor) to measure the internal stress. Further, the sample composition solution was spin coated onto this silicon wafer to form a film which is then converted to a siliceous film by the method described in each Example. The temperature of the wafer is returned to room temperature (23° C.), and the internal stress is again measured with the above laser internal stress measuring device. The film thickness is measured with an M-44 spectroscopic ellipsometer (manufactured by J. A. Woollam Co., Inc.).

Crack Limiting Film Thickness

A sample composition solution was spin coated onto a silicon wafer having a diameter of 10.16 cm (4 in.) and a thickness of 0.5 mm to form a film which is then converted to a siliceous film by the method described in each Example. In this case, samples with the film thickness being varied from about 0.5 μm to about 5 μm are prepared by varying the solid content of the sample composition solution or the rotating speed of the spin coater in the coating. After firing, the film surface is observed under a microscope (magnification: 120×) for cracks for each sample. The maximum film thickness free from cracks is regarded as crack limiting film thickness.

Modulus of Elasticity (Nanoindentation Method)

A sample composition solution was spin coated onto a silicon wafer having a diameter of 20.32 cm (8 in.) and a thickness of 1 mm to form a film which is then converted to a siliceous film by the method in each Example. For the siliceous film thus obtained, the modulus of elasticity is measured with a thin-film mechanical property evaluation system (Nano Indenter DCM, manufactured by MTS Systems Corporation, US).

Measurement of Pore Diameter

A sample composition solution was spin coated onto a silicon wafer having a diameter of 20.32 cm (8 in.) and a thickness of 1 mm to form a film which is then converted to a siliceous film by the method in each Example. For the siliceous film thus obtained, the pore diameter is measured by an X-ray diffuse scattering method with a multifunctional X-ray diffraction apparatus for surface structure evaluation (model ATX-G, manufactured by Rigaku Industrial Corporation).

INDUSTRIAL APPLICABILITY

The present invention provides a siliceous material which has good balance among stable low dielectric, mechanical strength high enough to withstand the advanced fine wiring process, and resistance to various chemicals. The use of the siliceous material according to the present invention as an intermetal dielectric or a premetal dielectric in a semiconductor device can realize higher integration density and a higher level of multilayering in integrated circuits.

As described above, the siliceous material according to the present invention can be used in the intermetal dielectric, as well as in the premetal dielectric. When a pore forming material is incorporated in the coating composition according to the present invention, micropores formed in the siliceous material are increased and the dielectric is further lowered and, consequently, a siliceous material which is particularly preferred for the intermetal dielectric can be realized.

When the coating composition according to the present invention is used, a siliceous film can be formed on electronic materials, as well as on a solid surface of various materials such as metals, ceramics, and woods. The present invention provides metal substrates (for example, silicon, SUS, tungsten, iron, copper, zinc, brass, and aluminum) having a siliceous film formed on their surface, and ceramic substrates having a siliceous film formed on their surface (for example, metal oxides such as silica, alumina, magnesium oxide, titanium oxide, zinc oxide, and tantalum oxide, and, further, metal nitrides such as silicon nitride, boron nitride, and titanium nitride, and silicon carbide).

The invention claimed is:

1. A coating composition comprising: a polyalkylsilazane compound; an acetoxysilane compound; and an organic solvent; where said polyalkylsilazane compound contains one or both groups represented by formulae (2) and (3)

wherein $R^5$ to $R^{11}$ each independently represent a hydrogen atom or an alkyl group having 1 to 3 carbon atoms, provided that both $R^5$ and $R^6$ do not simultaneously represent hydrogen and all of $R^9$ to $R^{11}$ do not simultaneously represent hydrogen, and further where the acetoxysilane compound is selected from tetraacetoxysilane, methyltriacetoxysilane, ethyltriacetoxysilane, ethoxytriacetoxysilane, isopropoxytriacetoxysilane, n-butoxytriacetoxysilane, dimethyldiacetoxysilane, diethyldiacetoxysilane, diisopropyldiacetoxysilane, di-n-butyldiacetoxysilane, dimethoxydiacetoxysilane, diethoxyacetoxysilane, diisopropoxydiacetoxysilane, and di-n-butoxydiacetoxysilane, and further where the composition comprises a pore forming agent, and where the pore agent is a siloxy-containing polyethylene oxide compound.

2. A siliceous material produced by coating a coating composition according to claim 1 onto a substrate or by filling a coating composition according to claim 1 into a frame or a groove, and firing the coating composition.

3. A semiconductor device comprising a siliceous material according to claim 2 as an intermetal dielectric.

4. A process for producing a siliceous material, comprising heating a coating composition according to claim 1 at a temperature of 350° C. or below for 1 to 60 min.

5. A coating composition comprising: a polyalkylsilazane compound; an acetoxysilane compound; and an organic solvent; where said polyalkylsilazane compound contains one or both groups represented by formulae (2) and (3)

wherein $R^5$ to $R^{11}$ each independently represent a hydrogen atom or an alkyl group having 1 to 3 carbon atoms, provided that both $R^5$ and $R^6$ do not simultaneous represent hydrogen and all of $R^9$ to $R^{11}$ do not simultaneous represent hydrogen, and further where the acetoxysilane compound is selected from tetraacetoxysilane, methyltriacetoxysilane, ethyltriacetoxysilane, ethoxytriacetoxysilane, isopropotriacetoxysilane, n-butoxytriacetoxysilane, dimethyldiacetoxysilane, diethyldiacetoxysilane, diisopropyldiacetoxysilane, di-n-butyldiacetoxysilane, dimethoxydiacetoxysilane, diethoxyacetoxysilane, diisopropoxydiacetoxysilane, and di-n-butoxydiacetoxysilane, and further where the acetoxysilane compound is in the range 5% to 40% by weight based on the weight of the polyalkylsilazane compound.

* * * * *